(12) United States Patent
Kim

(10) Patent No.: US 9,000,064 B2
(45) Date of Patent: Apr. 7, 2015

(54) COMPOSITION FOR FORMING PATTERN AND IN-PLANE PRINTING METHOD USING THE SAME

(71) Applicant: LG Display Co., Ltd., Seoul (KR)

(72) Inventor: Jin-Wuk Kim, Uiwang-Si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/444,551

(22) Filed: Jul. 28, 2014

(65) Prior Publication Data

US 2014/0367358 A1 Dec. 18, 2014

Related U.S. Application Data

(62) Division of application No. 11/802,552, filed on May 23, 2007, now Pat. No. 8,822,125.

(30) Foreign Application Priority Data

May 24, 2006 (KR) ................ 10-2006-0046560

(51) Int. Cl.
  C08J 3/28 (2006.01)
  G03F 7/20 (2006.01)
  B82Y 10/00 (2011.01)
  B82Y 40/00 (2011.01)
  G03F 7/00 (2006.01)
  G03F 7/004 (2006.01)
  G03F 7/027 (2006.01)
  H01L 21/312 (2006.01)

(52) U.S. Cl.
  CPC ............. *G03F 7/2002* (2013.01); *B82Y 10/00* (2013.01); *B82Y 40/00* (2013.01); *G03F 7/0002* (2013.01); *G03F 7/0046* (2013.01); *G03F 7/027* (2013.01); *H01L 21/3127* (2013.01); *G03F 7/004* (2013.01)

(58) Field of Classification Search
  CPC ................................ G03F 7/027; B82Y 10/00
  USPC .......................................... 522/150, 153, 160
  See application file for complete search history.

(56) References Cited

U.S. PATENT DOCUMENTS

| | | | | |
|---|---|---|---|---|
| 4,333,998 A | * | 6/1982 | Leszyk | ............... 430/12 |
| 4,771,078 A | * | 9/1988 | Schisler et al. | ........... 521/50.5 |
| 5,162,391 A | | 11/1992 | Ikari | |
| 5,340,661 A | * | 8/1994 | Van Havenbergh et al. | .. 428/690 |
| 5,416,180 A | | 5/1995 | Yokoyama et al. | |

(Continued)

FOREIGN PATENT DOCUMENTS

| | | |
|---|---|---|
| JP | 09-265184 | 10/1997 |
| JP | 09-178931 | 11/1997 |

(Continued)

OTHER PUBLICATIONS

Gun-Young Jung et al.; "Vapor-Phase Self-Assembled Monolayer for Improved Mold Release in Nanoimprint Lithography"; Langmuir 2005, vol. 21, pp. 1158-1161.

*Primary Examiner* — Chanceity Robinson

(74) *Attorney, Agent, or Firm* — McKenna Long & Aldridge LLP

(57) ABSTRACT

A composition for forming a pattern includes: about 1% to about 10% by weight of a liquid prepolymer, about 40% to about 60% by weight of an acrylate having a hydrophilic group, about 10% to about 20% by weight of a viscosity modifier, about 1% to about 5% by weight of a photoinitiator, and an additive.

4 Claims, 4 Drawing Sheets

(56) References Cited

U.S. PATENT DOCUMENTS

| | | |
|---|---|---|
| 6,900,250 B2 | 5/2005 | Uesugi et al. |
| 2003/0212162 A1 | 11/2003 | Uesugi et al. |
| 2004/0091696 A1* | 5/2004 | Nair et al. ............ 428/327 |
| 2004/0110856 A1 | 6/2004 | Young et al. |
| 2005/0170282 A1 | 8/2005 | Inno et al. |
| 2005/0261389 A1* | 11/2005 | Bratolavsky et al. .......... 522/71 |
| 2007/0289119 A1* | 12/2007 | Lee et al. .................... 29/592.1 |

FOREIGN PATENT DOCUMENTS

| | | |
|---|---|---|
| WO | 2006/114958 | 2/2006 |
| WO | 2006/031455 | 3/2006 |

* cited by examiner

COMPOSITION FOR FORMING PATTERN AND IN-PLANE PRINTING METHOD USING THE SAME

This application is a Divisional of application Ser. No. 11/802,552 filed May 23, 2007, which claims priority to Korean Patent Application No.10-2006-0046560, filed May 24, 2006, respectively, all of which are hereby incorporated by reference for all purposes as if fully set forth herein.

BACKGROUND OF THE INVENTION

1. Field of the Invention

The present invention relates to a composition for forming a pattern, and more particularly, to a composition of a resin for forming a pattern and an in-plane printing method using the same.

2. Discussion of the Related Art

Semiconductor devices and flat panel display devices include a plurality of fine patterns. To form the fine patterns on a substrate, such as wafer or glass, for example, a photolithographic method has been widely used. As shown in FIGS. 1A to 1E, a photolithographic method includes steps of coating a photoresist (PR) on a film, exposing the PR through a mask having fine patterns, developing the exposed PR, etching the film and stripping the PR.

FIGS. 1A to 1E are schematic perspective views illustrating a photolithographic method for forming a device according to the related art.

In FIG. 1A, a film 10 is formed on a substrate 1 and a photoresist (PR) layer 20 is formed on the film 10 through a step of coating a PR. The film 10 may include a semiconductor material or a metallic material.

In FIG. 1B, a mask 3 is disposed over the PR layer 20 and light is irradiated onto the PR layer 20 through the mask 3. The light may be ultraviolet (UV) light. Since the mask 3 has a shielding region and a transmissive region, a portion 21 of the PR layer 20 corresponding to the shielding region is not exposed to the light and the other portion 22 of the PR layer 20 corresponding to the transmissive region is exposed to the light. The other portion 22 of the PR layer 20 exposed to the light may experience a chemical transformation due to the exposure.

In FIG. 1C, the transformed portion 22 of the PR layer 20 is removed through a developing step using a developing solution. As a result, the non-exposed portion 21, i.e., a PR pattern 21 remains on the film 10 over the substrate 1.

In FIG. 1D, the film 10 is etched to form a pattern 11 using the PR pattern 21 as an etch mask. For example, the film 10 may be etched through a wet etching method or a dry etching method. A chemical solution may be sprayed onto the film 10 in the wet etching method, while a plasma generated between two electrodes contacts the film 10 in the dry etching method.

In FIG. 1E, the PR pattern 21 (of FIG. 1D) is removed and the pattern 11 on the substrate 1 is obtained.

Accordingly, the photolithographic method requires a photo mask and an exposure apparatus that are expensive. In addition, the photolithographic method results in a high production cost and takes a long time to manufacture due to repetitive masking steps based on the number of layers.

SUMMARY OF THE INVENTION

Accordingly, the present invention is directed to a composition for forming a patterning and an in-plane printing method using the same that substantially obviates one or more problems due to limitations and disadvantages of the related art.

An advantage of the present invention is to provide a composition for forming a pattern having a relatively high resolution.

Another advantage of the present invention is to provide an in-plane printing method without using a photo mask.

Another advantage of the present invention is to provide an in-plane printing method where a pattern is formed using a mold.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a composition for forming a pattern includes: about 1% to about 10% by weight of a liquid prepolymer; about 40% to about 60% by weight of an acrylate having a hydrophilic group; about 10% to about 20% by weight of a viscosity modifier; about 1% to about 5% by weight of a photoinitiator; and an additive.

In another aspect, a composition for forming a pattern includes: about 10% to about 30% by weight of a liquid prepolymer having a hydrophilic group; about 10% to about 20% by weight of a viscosity modifier; about 1% to about 5% by weight of a photoinitiator; and an additive.

In another aspect, an in-plane printing method using a composition for forming a pattern includes: forming a thin film on a substrate; forming a resist layer of the composition on the thin film, wherein the composition comprises: about 1% to about 10% by weight of a liquid prepolymer; about 40% to about 60% by weight of an acrylate having a hydrophilic group; about 10% to about 20% by weight of a viscosity modifier; about 1% to about 5% by weight of a photoinitiator; and an additive; disposing a mold over the resist layer; pressing the mold toward the resist layer and irradiating light onto the resist layer through the mold to form a resist pattern; separating the mold from the resist pattern; and etching the thin film using the resist pattern as an etch mask to form a thin film pattern.

An in-plane printing method using a composition for forming a pattern includes: forming a thin film on a substrate; forming a resist layer of the composition on the thin film, wherein the composition comprises: about 10% to about 30% by weight of a liquid prepolymer having a hydrophilic group; about 10% to about 20% by weight of a viscosity modifier; about 1% to about 5% by weight of a photoinitiator; and an additive; disposing a mold over the resist layer; pressing the mold toward the resist layer and irradiating a light onto the resist layer through the mold to form a resist pattern; separating the mold from the resist pattern; and etching the thin film using the resist pattern as an etch mask to form a thin film pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

FIGS. 2A to 2F are cross-sectional views illustrating an in-plane printing method according to embodiments of the present invention. The in-plane printing method includes a step of forming a resist layer on a thin film over a substrate, a step of forming a resist pattern using a mold, a step of etching the thin film using the resist pattern and a step of removing the resist pattern.

Figure 1A:
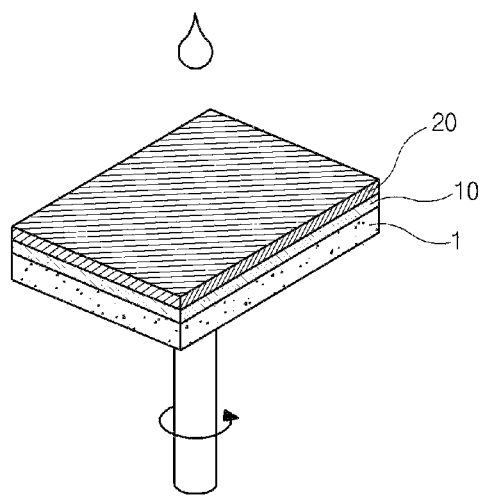
FIGS. 1A through and including 1E are schematic perspective views illustrating a photolithographic method for forming a device according to the related art.
Figure 1B:
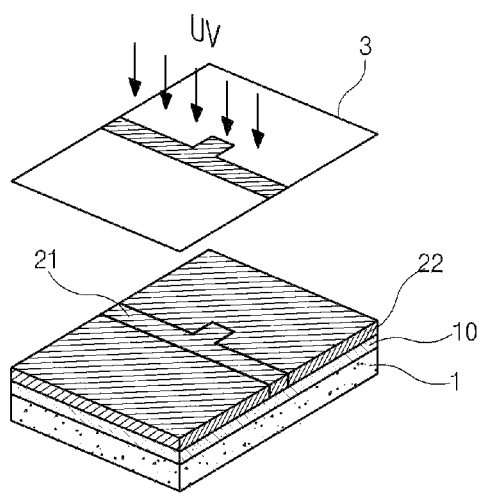
Figure 1C:
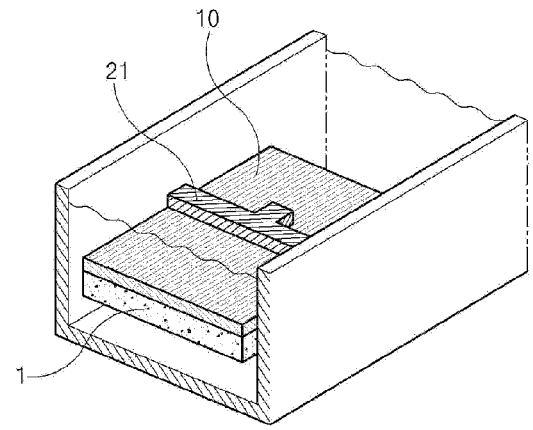
Figure 1D:
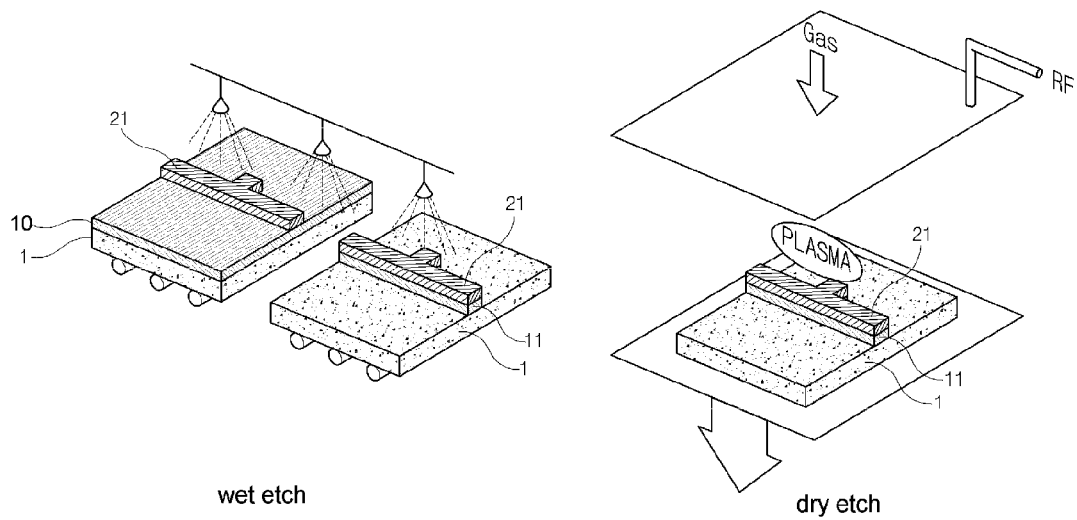
Figure 1E:
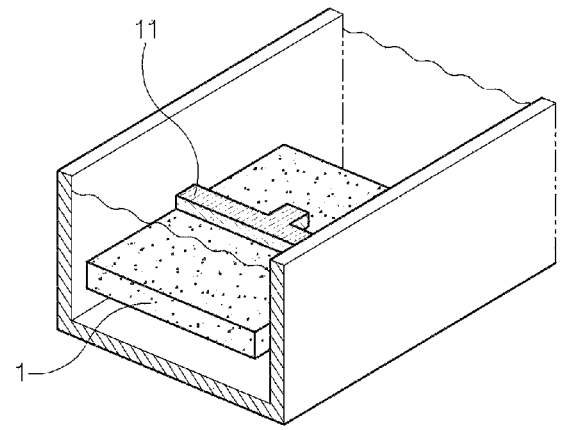
Figure 2A:
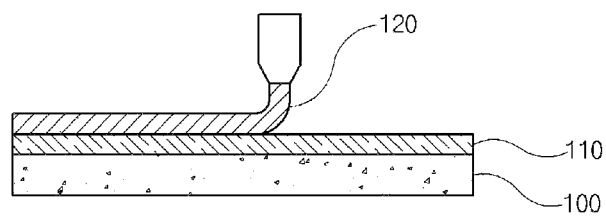
FIGS. 2A through and including 2F are cross-sectional views illustrating an in-plane printing method according an embodiment of the present invention.

In FIG. 2A, a thin film 110 is formed on a substrate 100 and a resist layer 120 is formed on the thin film 110. The thin film 110 may be for example, an electrode, an organic material layer or a semiconductor layer of a semiconductor device. In addition, the thin film 110 may be, for example, one of a gate electrode, a source electrode, a drain electrode, a gate line and a data line of a liquid crystal display (LCD) device.

Figure 2B:
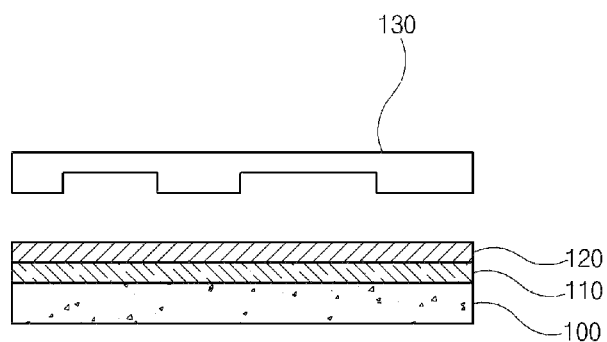

In FIG. 2B, a mold 130, which has substantially convex and concave portions, is disposed over the resist layer 120. The mold 130 may be one of a soft mold including one of polydimethylsiloxane (PDMS) and polyurethane acrylate and a hard mold including quartz. The shape of the substantially convex and concave portions may be determined based on a thin film pattern and a thickness of the resist layer 120.

Figure 2C:
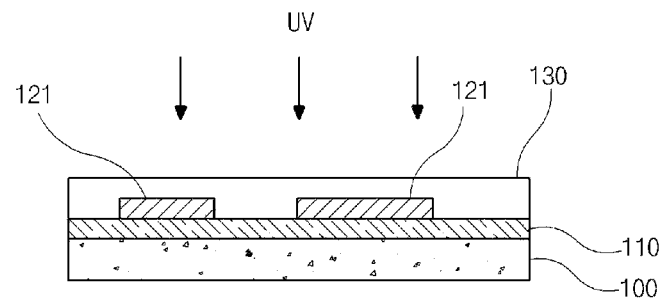

In FIG. 2C, after the mold 130 is aligned such that the substantially convex and concave portions of the mold 130 face the resist layer 120 (of FIG. 2B), the mold 130 is pressed so that a top surface of the mold 130 can contact the resist layer 120. At the same time, ultraviolet (UV) light is irradiated onto the resist layer 120 through the mold 130. Several forces act upon the resist layer 120, for example, such as a repulsive force between the mold 130 and the resist layer 120, a capillary force that draws the resist layer 120 into the substantially concave portions of the mold 130, gravity applied to the resist layer 120, and a frictional force or adhesion force between the substrate 100 and the resist layer 120. Therefore, a force pushing the resist layer 120 out into the substantially concave portions of the mold 130 results from the combination of the several forces, and the resist layer 120 moves into the substantially concave portions of the mold 130. The resist layer 120 in the substantially concave portions of the mold 130 is cured and polymerized by the UV light or heat to form a resist pattern 121.

Figure 2D:
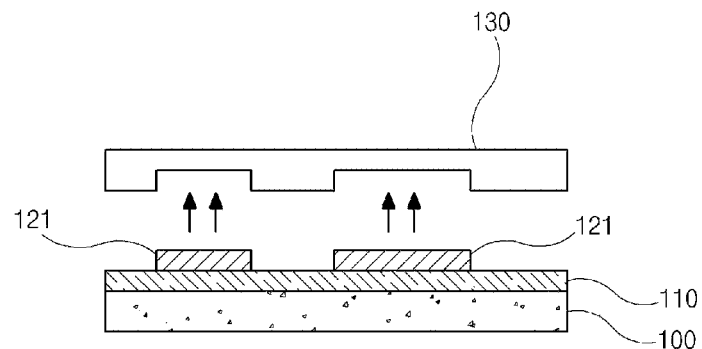

In FIG. 2D, after the resist layer 120 (of FIG. 2B) is cured to form the resist pattern 121, the mold 130 is removed and the resist pattern 121 corresponding to the substantially concave portions of the mold 130 remains on the thin film 110.

Generally, when a resist pattern is formed on a substrate using a mold, it is necessary that a surface energy of the mold is lower than a surface energy of the resist pattern so that the mold and resist pattern can be easily separated. Surface energy is defined as an energy per unit area required to make an interface between a solid or liquid phase material and a gas phase material. Because the solid or liquid phase material has a larger surface energy, it is more difficult to make an interface with the gas phase material. In addition, an interface energy between two contacting materials of solid or liquid phase may be defined by a relation of the surface energies of the two contacting materials.

Therefore, in the in-plane printing method, to adequately obtain a predetermined resist pattern 121, the surface energies of the mold 130, the resist pattern 121 and the substrate 100 (or the thin film 110) and the interface energies between the resist pattern 121 and the mold 130 and between the resist pattern 121 and the substrate 100 (or the thin film 110) should satisfy the following equation.

$$A_{RM}(\gamma_R+\gamma_M-\gamma_{RM})>A_{RS}(\gamma_R+\gamma_S-\gamma_{RS}) \quad \text{equation (1)}$$

where $\gamma_M$, $\gamma_R$ and $\gamma_S$ are surface energies of the mold, the resist pattern and the substrate (or the thin film), respectively, $A_{RM}$ and $A_{RS}$ are areas of interfaces between the resist pattern and the mold and between the resist pattern and the substrate (or the thin film), respectively, and $\gamma_{RM}$ and $\gamma_{RS}$ are interface energies between the resist pattern and the mold and between the resist pattern and the substrate (or the thin film), respectively.

A work of adhesion may be defined by subtracting an interface energy of two contacting materials from a sum of the surface energies of the two contacting materials. Accordingly, when the value obtained by multiplying the interface area by the work of adhesion between the resist pattern and the substrate (or the thin film) is larger than the value obtained by multiplying the interface area by the work of adhesion between the resist pattern and the mold, the predetermined resist pattern is formed.

The work of adhesion between the resist pattern 121 and the substrate 100 (or the thin film 110) may be expressed by the following equation.

$$W_{RS}=\gamma_R+\gamma_S-\gamma_{RS} \quad \text{equation (2)}$$

From the equation (2), which may be obtained from Good-Girifalco theory, decrease of the interface energy IRS is required to increase the work of adhesion $W_{RS}$ between the resist pattern 121 and the substrate 100 (or the thin film 110).

In addition, the interface energy between the resist pattern 121 and the substrate 100 (or the thin film 110) may be expressed by the following equation that is referred to as Young's equation.

$$\gamma_{RS}=\gamma_S-\gamma_R(\cos\theta) \quad \text{equation (3)}$$

where θ is a contact angle between the resist pattern 121 and the substrate 100 (or the thin film 110) within a range of about 0° to about 90°.

From equations (2) and (3), as the contact angle decreases, the work of adhesion increases between the resist pattern 121 and the substrate 100 (or the thin film 110).

Accordingly, a composition for the resist pattern 121 may include fluoro acrylate/methacrylate of a liquid prepolymer having a low contact angle with respect to the substrate 100 (or the thin film 110). In addition, since polydimethylsiloxane (PDMS) for the soft mold has a hydrophobic group, the composition for the resist pattern 121 may include an acrylate having a hydrophilic group when the mold 130 is a soft mold. Moreover, the acrylate of the composition for the resist pattern 121 may include a plurality of substituents that can exist without an additional mark. For example, a multi-acrylate such as di-acrylate and tri-acrylate may be used as the acrylate.

As a result, a composition for forming a resist pattern according to a first embodiment of the present invention may include about 1% to about 10% by weight of a liquid prepolymer such as fluoro acrylate/methacrylate, about 40% to about 60% by weight of an acrylate having a hydrophilic group, about 10% to about 20% by weight of a viscosity modifier, about 1% to about 5% by weight of a photoinitiator and an additive. The components and the composition ratios of the composition are illustrated in the following table.

TABLE 1

| | component | | | | |
|---|---|---|---|---|---|
| | liquid prepolymer | acrylate having hydrophilic group | viscosity modifier | photoinitiator | additive |
| composition ratio (by weight) | about 1%~about 10% | about 40%~about 60% | about 10%~about 20% | about 1%~about 5% | balanced |

For example, the liquid prepolymer may include one of octafluoropentyl acrylate and octafluoropentyl methacrylate, and the acrylate having a hydrophilic group may include one of diethylene glycol diacrylate and diethylene glycol dimethacrylate. In addition, the viscosity modifier may include one of butyl acrylate and butyl methacrylate, and the photoinitiator may include Irgacure 379®. Furthermore, the additive may include a resin material.

The work of adhesion between the resist pattern 121 and the substrate 100 (or the thin film 110) may be further improved by an additional chemical reaction using light. Accordingly, a composition for forming a resist pattern according to a second embodiment of the present invention may include about 1% to about 10% by weight of a liquid prepolymer such as fluoro acrylate/methacrylate, about 40% to about 60% by weight of an acrylate having a hydrophilic group, about 10% to about 20% by weight of a viscosity modifier, about 1% to about 5% by weight of a photoinitiator, about 10% to about 20% by weight of a photoreactor and an additive. The components and the composition ratios of the composition are illustrated in the following table.

TABLE 2

| | component | | | | | |
|---|---|---|---|---|---|---|
| | liquid prepolymer | acrylate having hydrophilic group | viscosity modifier | photoinitiator | photoreactor | additive |
| composition ratio (by weight) | about 1%~about 10% | about 40%~about 60% | about 10%~about 20% | about 1%~about 5% | about 10%~about 20% | balanced |

For example, the liquid prepolymer may include one of octafluoropentyl acrylate and octafluoropentyl methacrylate, and the acrylate having a hydrophilic group may include one of diethylene glycol diacrylate and diethylene glycol dimethacrylate. In addition, the viscosity modifier may include one of butyl acrylate and butyl methacrylate, and the photoinitiator may include Irgacure 379®. Furthermore, the photoreactor may include one of glycidyl acrylate and glycidyl methacrylate, and the additive may include a resin material.

The work of adhesion between the resist pattern 121 and the substrate 100 (or the thin film 110) may be further improved by an additional chemical reaction using heat. Accordingly, a composition for forming a resist pattern according to a third embodiment of the present invention may include about 1% to about 10% by weight of a liquid prepolymer such as fluoro acrylate/methacrylate, about 40% to about 60% by weight of an acrylate having a hydrophilic group, about 10% to about 20% by weight of a viscosity modifier, about 1% to about 5% by weight of a photoinitiator, about 10% to about 20% by weight of a thermal flow derivative and an additive. The components and the composition ratios of the composition are illustrated in the following table.

TABLE 3

| | component | | | | | |
|---|---|---|---|---|---|---|
| | liquid prepolymer | acrylate having hydrophilic group | viscosity modifier | photoinitiator | thermal flow derivative | additive |
| composition ratio (by weight) | about 1%~about 10% | about 40%~about 60% | about 10%~about 20% | about 1%~about 5% | about 10%~about 20% | balanced |

For example, the liquid prepolymer may include one of octafluoropentyl acrylate and octafluoropentyl methacrylate, and the acrylate having a hydrophilic group may include one of diethylene glycol diacrylate and diethylene glycol dimethacrylate. In addition, the viscosity modifier may include one of butyl acrylate and butyl methacrylate, and the photoinitiator may include Irgacure 379®. Furthermore, the thermal flow derivative may include one of polystyrene, polymethyl acrylate and polymethyl methacrylate, and the additive may include a resin material.

A composition for forming a resist pattern according to a fourth embodiment of the present invention may include a liquid prepolymer having a hydrophilic group instead of the liquid prepolymer and the acrylate having a hydrophilic group of the first to third embodiments. Accordingly, the composition for forming a resist pattern according to the fourth embodiment may include about 10% to about 30% by weight of a liquid prepolymer having a hydrophilic group, about 10% to about 20% by weight of a viscosity modifier, about 1% to about 5% by weight of a photoinitiator, about 10% to about 20% by weight of a thermal flow derivative and an additive. The components and the composition ratios of the composition are illustrated in the following table.

TABLE 4

| | component | | | |
|---|---|---|---|---|
| | liquid prepolymer having hydrophilic group | viscosity modifier | photoinitiator | additive |
| composition ratio (by weight) | about 10%~about 30% | about 10%~about 20% | about 1%~about 5% | balanced |

For example, the liquid prepolymer having a hydrophilic group may include one of octafluoro-2-hydroxyl-6-heptylacrylate and octafluoro-2-hydroxyl-6-trifluoromethylheptylmethacrylate, and the viscosity modifier may include one of butyl acrylate and butyl methacrylate. In addition, the photoinitiator may include Irgacure 379®, and the additive may include a resin material.

Although not shown in TABLE 4, the composition according to the fourth embodiment may further include about 10% to about 20% by weight of one of a photoreactor and a thermal flow derivative to improve the work of adhesion between the resist pattern and the substrate (or the thin film). Since the resist pattern of the composition according to the present invention has an improved work of adhesion with respect to the substrate (or the thin film), the resist pattern having an excellent profile is obtained.

Referring again to FIG. 2D, after the mold 130 is separated from the substrate 100, the substrate 100 having the thin film 110 and the resist pattern 121 is transferred to an etch apparatus.

Figure 2E:
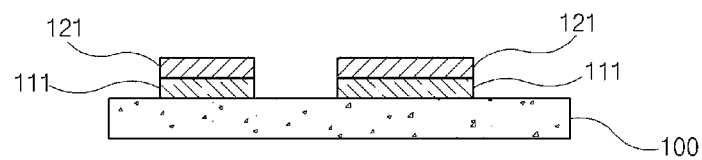

In FIG. 2E, the thin film 110 is etched using the resist pattern 121 as an etch mask through one of wet and dry etching methods to form a thin film pattern 111.

Figure 2F:
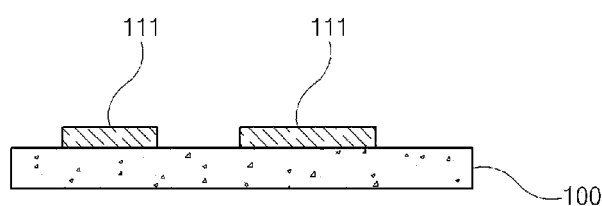

In FIG. 2F, the resist pattern 121 (of FIG. 2E) is removed by a stripping step, and the thin film pattern 111 remains on the substrate 100. The quality of the thin film pattern 111 may be determined through a subsequent electrical or optical inspection step.

Although not shown in FIGS. 2A to 2F, after the mold 130 is separated from the substrate 100, the mold 130 is cleaned with ultraviolet (UV) light and ozone ($O_3$) and recycled.

In the present invention, since the in-plane printing method uses the mold instead of an expensive photo mask, production cost is reduced and the fabrication process is simplified. In addition, a resist pattern having a composition according to the first to fourth embodiments has a relatively low work of adhesion with respect to the mold and a relatively high work of adhesion with respect to the substrate (or the thin film). As a result, transformation and stress due to the separation of the mold are minimized and a resist pattern having an excellent profile is obtained. Therefore, a thin film pattern of an excellent resolution is formed and the lifetime of the mold is lengthened.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An in-plane printing method using a patterning composition, comprising:
    forming a thin film on a substrate;
    forming a resist layer of the patterning composition on the thin film, wherein the patterning composition consists essentially of:
        1% to 10% by weight of a liquid prepolymer, wherein the liquid prepolymer includes one of octafluoropentyl acrylate and octafluoropentyl methacrylate;
        40% to 60% by weight of an acrylate having a hydrophilic group, wherein the acrylate having the hydrophilic group includes one of diethylene glycol diacrylate and diethylene glycol dimethacrylate;
        10% to 20% by weight of a viscosity modifier, wherein the viscosity modifier includes one of butyl acrylate and butyl methacrylate;
        1% to 5% by weight of a photoinitiator;
        10% to 20% by weight of a photoreactor, wherein the photoreactor includes one of glycidyl acrylate and glycidyl methacrylate;
        10% to 20% by weight of a thermal flow derivative, wherein the thermal flow derivative includes one of polystyrene, polymethyl acrylate and polymethyl methacrylate; and
        an additive,
        wherein the patterning composition is curable by a UV light;
    disposing a mold over the resist layer;
    pressing the mold toward the resist layer and irradiating light onto the resist layer through the mold to form a resist pattern;
    separating the mold from the resist pattern; and
    etching the thin film using the resist pattern as an etch mask to form a thin film pattern.

2. The method according to claim 1, wherein the mold is selected from the group consisting of polydimethylsiloxane (PDMS), polyurethane acrylate and quartz.

3. An in-plane printing method using a patterning composition, comprising:
    forming a thin film on a substrate;
    forming a resist layer of the patterning composition on the thin film, wherein the patterning composition consists essentially of:
        10% to 30% by weight of a liquid prepolymer having a hydrophilic group, wherein the liquid prepolymer having the hydrophilic group includes one of octafluoro-2-hydroxyl-6-trifluoromethylheptylacrylate and octafluoro-2-hydroxyl-6-trifluoromethylheptylmethacrylate;
        10% to 20% by weight of a viscosity modifier, wherein the viscosity modifier includes one of butyl acrylate and butyl methacrylate;
        1% to 5% by weight of a photoinitiator;
        10% to 20% by weight of a photoreactor, wherein the photoreactor includes one of glycidyl acrylate and glycidyl methacrylate;
        10% to 20% by weight of a thermal flow derivative, wherein the thermal flow derivative includes one of polystyrene, polymethyl acrylate and polymethyl methacrylate; and
        an additive,
        wherein the patterning composition is curable by a UV light;
    disposing a mold over the resist layer;

pressing the mold toward the resist layer and irradiating a light onto the resist layer through the mold to form a resist pattern;

separating the mold from the resist pattern; and etching the thin film using the resist pattern as an etch mask to form a thin film pattern.

4. The method according to claim 3, wherein the mold is selected from the group consisting of polydimethylsiloxane (PDMS), polyurethane acrylate and quartz.

* * * * *